US005557079A

United States Patent [19]

Jackson et al.

[11] Patent Number: 5,557,079

[45] Date of Patent: Sep. 17, 1996

[54] ELECTRONIC DEVICE WITH SHIELDED KEYPAD INTERFACE

[75] Inventors: Greg D. Jackson, Plantation; Tyler D. Jensen, Sunrise; Julio C. Castaneda, Coral Springs, all of Fla.

[73] Assignee: Motorola, Inc., Schaumburg, Ill.

[21] Appl. No.: 497,829

[22] Filed: Jul. 3, 1995

[51] Int. Cl.[6] .................... H01H 9/02; H05K 5/00

[52] U.S. Cl. .................... 200/5 A; 361/818; 200/305; 455/128

[58] Field of Search .................... 200/5 A, 304, 200/305; 361/680, 681, 816, 817, 818; 455/128

[56] References Cited

U.S. PATENT DOCUMENTS

| | | | |
|---|---|---|---|
| 3,890,480 | 6/1975 | Berling et al. | 200/5 R X |
| 4,336,529 | 6/1982 | Buan | 200/5 A X |
| 4,456,800 | 6/1984 | Holland | 200/5 A |
| 4,680,724 | 7/1987 | Sugiyama et al. | 361/680 |
| 5,031,027 | 7/1991 | Dorinski et al. | 257/660 |
| 5,241,695 | 8/1993 | Roshitsh et al. | 455/128 |

*Primary Examiner*—J. R. Scott

*Attorney, Agent, or Firm*—Andrew S. Fuller

[57] ABSTRACT

An electronic device (100) has a housing (110), and a shielded keypad interface (150) for actuating a switch (285, 290) accessible through an opening (115) within the housing (110). The keypad interface (150) has a key surface (265) that is aligned with the opening (115) and with the switch (285, 290). A conductive layer (250) between the key surface (265) and the switch (285, 290) covers the opening (115). The conductive layer (250) is electrically isolated from the switch (285, 290), and coupled to electrical ground (255) to provide an electrical shield for the keypad interface (150).

9 Claims, 2 Drawing Sheets

ELECTRONIC DEVICE WITH SHIELDED KEYPAD INTERFACE

TECHNICAL FIELD

This invention relates in general to electronic devices with a user keypad interface.

BACKGROUND OF THE INVENTION

Electronic devices, such as two-way portable radios, typically employ electrical circuitry that emits a substantial amount of electromagnetic radiation. The electrical circuitry may also include electronic components that are themselves susceptible to electromagnetic interference. Generally, radiation-emitting components and radiation-sensitive components are shielded with metal shields and the like. However, individual component shielding can be expensive and sometimes impractical. Various approaches are available in the prior art that attempt to provide an overall shield for the circuitry within an electronic device. One common approach is the use of plating or conductive painting on the housing enclosure for the electronic device. The manufacturing process for such an approach can be very expensive and labor intensive. Moreover, the effectiveness of such shielding may be reduced because of holes commonly found in a housing.

A typical portable radio may include a keypad interface that presents the user with access to device controls. In most common designs employing keypads, keyholes are formed within the housing, such that actuation of the keys may cause corresponding actuation of switches located within the housing. These key holes are but one example of a source of potential breach of electrical shielding material disposed on the housing enclosure to protect the circuitry of the electronic device. It is desirable to protect against potential interference for sensitive circuitry in an electronic device in a cost-effective manner. Shielding approaches of the prior art do not sufficiently address this problem.

DETAILED DESCRIPTION OF THE PREFERRED EMBODIMENT

Generally, the present invention provides for an electronic device having a shielded keypad interface. In the preferred embodiment, a keypad is used to actuate switches on a circuit-carrying substrate. The keypad has at least one actuator or key button in register with a switch contact, such as a conductive pad. A resilient insulative material separates the actuator button and the switch contact. A conductive layer, disposed on the insulative layer and coupled to the electrical ground, provides an electrical shield for the keypad. When the actuator button is depressed, it causes the switch contact to form an electrical signal path at the switch. Preferably, the electrical shield formed by the conductive layer covers any key access openings needed to support the keypad.

Figure 1:
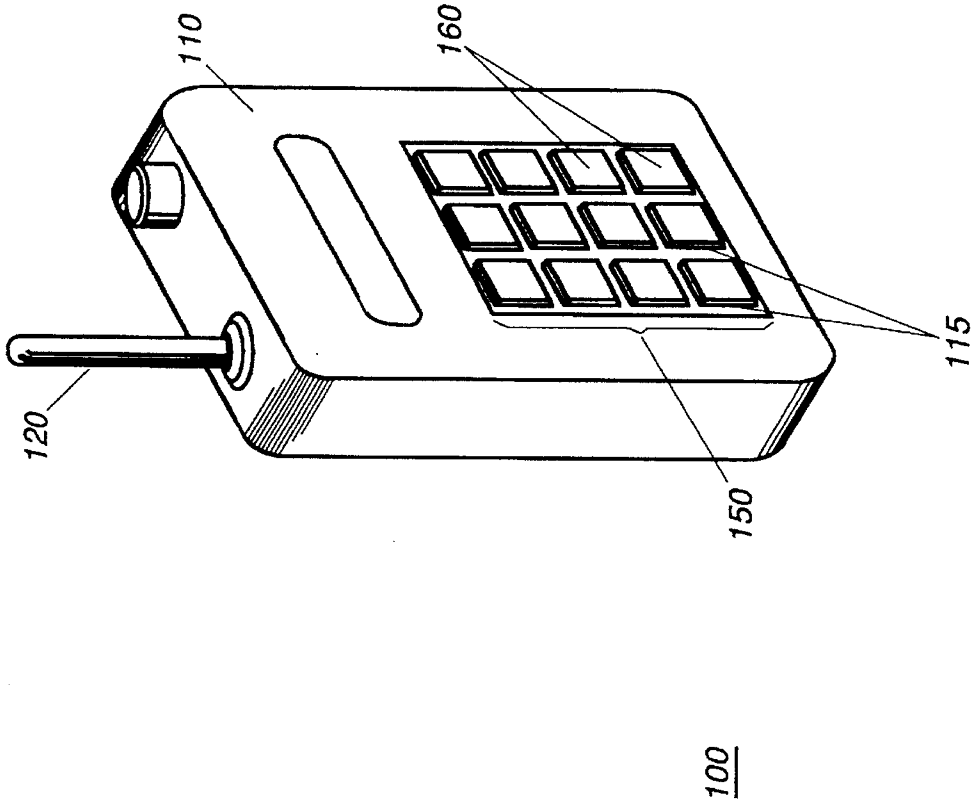
FIG. 1 is an isometric fragmentary view of a portable radio incorporating a shielded keypad interface, in accordance with the present invention.

Referring now to FIG. 1, an isometric view of an electronic device 100 is shown, in accordance with the present invention. The electronic device 100 is a two-way portable radio which contains circuitry that supports two-way communications over a radio frequency (RF) link, as is well known in the art. A radio housing 110, typically formed from plastic or other similar material, encloses or carries the electrical circuitry for the radio 100. The radio 100 also includes a keypad 150 which provides an interface to enable control access to the internal functions of the radio. The keypad interface 150 includes switch actuator buttons, or keys 160, that enable radio functions. Openings or key holes 115 within the radio housing 110 enable each key to freely move when depressed to actuate a corresponding switch internal to the radio 100. According to the present invention, the keypad interface 150 is shielded to protect the radio's internal circuitry from interference caused by electromagnetic radiation present outside the radio 100. Such interference may be caused from a variety of sources, including the radio's own antenna 120.

Figure 2:
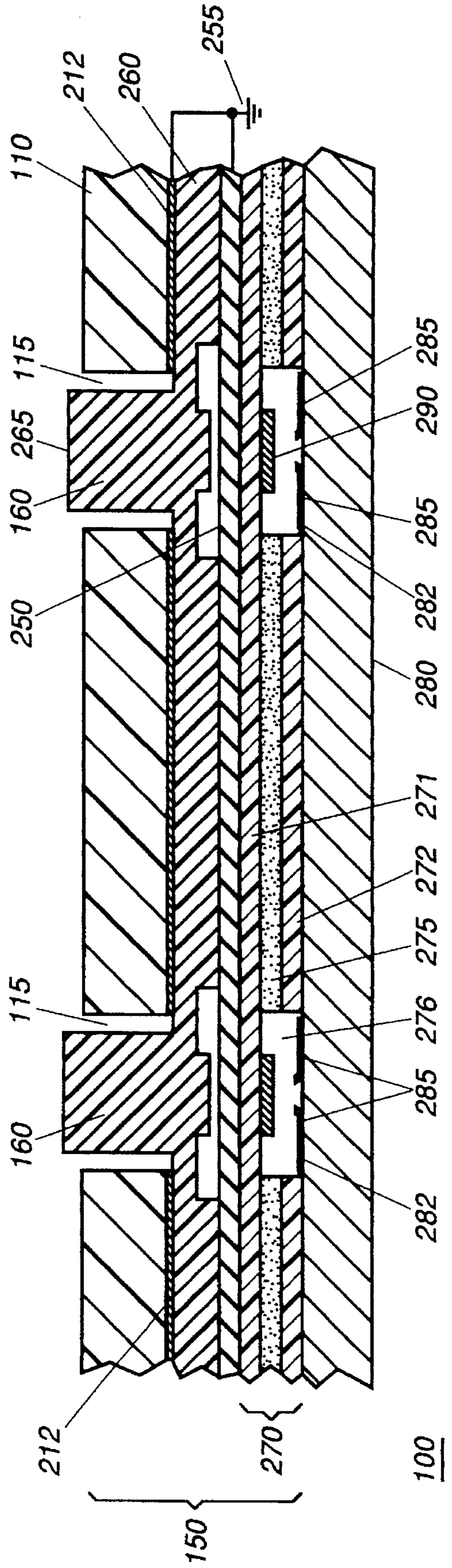
FIG. 2 is a fragmentary cross-sectional view of a portion of the radio and keypad interface highlighting significant structural components, in accordance with the present invention.

FIG. 2 shows a fragmentary cross-sectional view of a portion of the radio 100, including the shielded radio keypad 150, in accordance with the present invention. The radio 100 includes a circuit carrying substrate, such as a printed circuit board 280 disposed adjacent to the keypad 150. The radio 100 includes at least one switch 285, 290 having portions formed on the printed circuit board 280 and on the keypad 150. The switch 285, 290 includes an interrupted signal line 285 that forms a pair of switch ports. The switch ports 285 are electrically coupled to other circuitry 282 of the radio to enable specific radio features. The switch 285, 290 also includes a conductive pad 290 that operates as a switch contact for closing the switch, i.e., for bridging the interrupted signal lines or pair of switch ports 285 on the printed circuit board 280. The switch contact 290 is situated on the keypad 150 and is maintained in a spaced-apart relationship from the switch ports 285 of the printed circuit board 280 when the switch is not actuated.

The keypad 150 includes a resilient insulative material 270 that interfaces with the printed circuit board 280. The insulative material 270 is formed using two layers of polyester film material 271, 272 which are separated by an adhesive layer 275. In the preferred embodiment, the insulative material 270 is formed from commonly available Mylar, and is impermeable to oil. The insulative material overlays the printed circuit board 280 and protects against the entry of contaminants, such as face oil, that could potentially affect the internal components of the radio 100. Preferably, a cavity or recess 276 is formed on the surface of the insulative material that interfaces with the printed circuit board 280. The cavity 276 can be formed by excising a portion of the polyester layer that is adjacent to the printed circuit board 280. The switch contact 290 is disposed on the surface of the insulative material 270 within the cavity 276, which effectuates the spaced apart relationship between the switch contact 290 and the switch ports 285.

Switch actuators or keys 160 are integrally formed, such as by molding, on a sheet of continuous resilient material 260, such as rubber and the like. Each key 160 is aligned so as to be in register with a switch contact 290. The key 160 protrudes through a key hole 115 within the housing that is aligned with a corresponding switch contact 290. As such, the key hole 115, the key 160 or an external surface 265 thereof, the switch contact 290, and the corresponding switch ports 285, are all aligned so as to be in register with each other. A user engages the switch 285, 290 by depressing the key 160 via the key surface 265. When the key 160 is not depressed, the insulative material 270 maintains a spaced apart relationship between the switch contact 290 and the switch ports 285. When the key 160 is depressed, it forces the switch contact 290 to engage the switch ports, thereby forming an electrical signal path within the circuitry on the printed circuit board 280. Preferably, the keypad 150 is assembled such that the key 160 is spring loaded against the housing when the key 160 is not depressed.

A significant aspect of the present invention is the provision of an electrical shield for the keypad interface 150. Accordingly, a conductive layer 250 is disposed between the radio circuitry 282, including switch elements 285, 290, and the openings 115 of the housing 110 for the key pad interface 150. In the preferred embodiment, the conductive layer 250 is disposed on the insulative material 270 between key button 160 and the switch contact 290. Preferably, the conductive layer 250 is formed by metallizing the resilient insulative material 270, such as by sputtering or painting, or by interposing a metallic or other conductive sheet material between the insulative material 270 and the exterior surface 265 of the keypad interface 150. The conductive layer 250 is coupled to electrical ground 255 to form the electrical shield. The insulative layer electrically isolates the conductive layer 250 from the switch 285, 290 and other circuitry 282 of the radio 100. Preferably, portions of the housing 110 are also treated with conductive material 212, such as by painting, and the conductive material 212 also coupled to electrical ground 255 to provide a more effective electromagnetic shield for the radio 100.

When fully assembled, the keypad interface 150, including the keys 160 and conductive layer 250, is disposed adjacent to the housing 110 such that the keys 160 protrude through the openings 115 within the housing 110. As a result, the conductive layer 250 overlays or covers the openings 115 of the housing 110 to provide electromagnetic shielding for the internal circuitry.

The present invention provides for significant benefits over the prior art. Prior art keypad interfaces are generally not shielded to protect against external electromagnetic radiation entering into the electronic device. This creates potential interference for the electrical circuitry of the electronic device. The present invention provides for a shield integrally formed with the keypad interface that covers the key access openings within the housing of the electronic device to protect against external electromagnetic radiation. The recognition of this source of potential interference and the provision of a shield integrated within the keypad interface are significant aspects of the present invention.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. An electronic device having a shielded keypad interface, comprising:

a housing having a keypad interface portion with an opening therein that forms a key hole;

a substrate mounted within the housing, the substrate having circuitry including switch contacts mounted thereon;

a keypad mechanically coupled to the housing, comprising:

an actuator mounted within the key hole, the actuator having an externally accessible key surface; and a resilient insulative material having first and second opposing surfaces, the first surface being metallized with conductive material, the second surface having a movable contact disposed thereon, the movable contact being aligned with the actuator the conductive material being coupled to electrical ground;

wherein the conductive material provides an electrical shield for the circuitry.

2. The electronic device of claim 1, wherein the resilient insulative material is impermeable to oil.

3. The electronic device of claim 1, wherein the movable contact comprises a conductive pad.

4. The electronic device of claim 1, wherein the resilient insulative material comprises first and second layers of Mylar adhesively bonded together, the first layer being metallized, and the cavity being formed within the second layer.

5. The electronic device of claim 1, wherein the housing has metallization disposed thereon, and the conductive material is electrically coupled to the metallization of the housing.

6. An electronic device having a shielded keypad interface, comprising:

a housing having a keypad interface and having a button hole extending through the keypad interface;

a substrate having circuitry mounted within the housing, the circuitry including a pair of switch contacts;

a keypad disposed adjacent to the pair of switch contacts, the keypad comprising:

a resilient insulative material having first and second opposing surfaces, the first surface being metallized with an electrically conductive material, the second surface having a cavity;

a contact pad disposed within the cavity of the resilient insulative material;

an actuator button disposed within the housing and having a portion extending through the button hole, the actuator button being in register with the conductive pad;

wherein the conductive material is electrically grounded and provides an electrical shield that protects the circuitry from electromagnetic interference through the opening in the keypad interface.

7. The electronic device of claim 6, wherein the resilient material is impermeable to oil.

8. The electronic device of claim 7, wherein the resilient insulative material comprises first and second layers of Mylar adhesively bonded together, the first layer being metallized, and the cavity being formed within the second layer.

9. The electronic device of claim 6, wherein the housing has metallization disposed thereon, and the conductive material is electrically coupled to the metallization of the housing.

* * * * *